(12) United States Patent
Hwang

(10) Patent No.: US 7,696,080 B2
(45) Date of Patent: Apr. 13, 2010

(54) METHOD FOR MANUFACTURING SIP SEMICONDUCTOR DEVICE

(75) Inventor: Jong-Taek Hwang, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 305 days.

(21) Appl. No.: 11/844,423

(22) Filed: Aug. 24, 2007

(65) Prior Publication Data

US 2008/0057674 A1    Mar. 6, 2008

(30) Foreign Application Priority Data

Aug. 30, 2006    (KR) ...................... 10-2006-0082741

(51) Int. Cl.
*H01L 21/44* (2006.01)
*H01L 21/4763* (2006.01)
(52) U.S. Cl. .................. 438/612; 438/637; 228/223; 257/621; 257/E21.211; 257/E21.476
(58) Field of Classification Search .............. 438/667, 438/698, 613, 674, 928, 612, 637; 257/621, 257/E23.011, E21.569, E23.067, E21.021; 228/233
See application file for complete search history.

(56) References Cited

U.S. PATENT DOCUMENTS 6,494,361 B1 * 12/2002 Scanlan et al. .............. 228/223
2007/0045780 A1 * 3/2007 Akram et al. ............... 257/621

* cited by examiner

*Primary Examiner*—W. David Coleman
*Assistant Examiner*—Shaka Scarlett
(74) *Attorney, Agent, or Firm*—Sherr & Vaughn, PLLC

(57) ABSTRACT

A method for manufacturing an SIP semiconductor device is provided. In this method, a first Organic Solderability Preservative (OSP) is coated over an upper surface of a semiconductor device including a plurality of elements and a first through electrode. An electrochemical plate (ECP) process is then performed on the semiconductor device. A second OSP is then coated over a lower surface of the semiconductor device, the lower surface including a Cu plug that has been formed over the first through electrode through the ECP process. The upper and lower (first and second) OSPs are used to prevent the Cu plug from being easily oxidized when exposed to the air.

20 Claims, 3 Drawing Sheets

METHOD FOR MANUFACTURING SIP SEMICONDUCTOR DEVICE

Figure 1A:
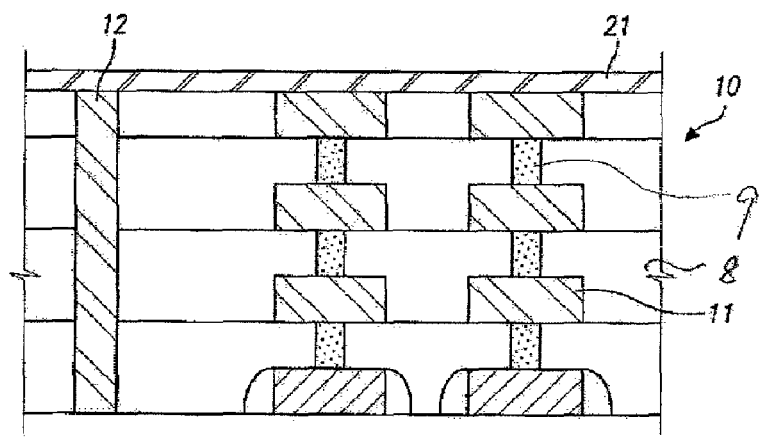

The present application claims priority under 35 U.S.C. 119 to Korean Patent Application No. 10-2006-0082741, filed on Aug. 30, 2006, which is hereby incorporated by reference in its entirety.

BACKGROUND

Technologies required to achieve smaller and lighter semiconductor devices include technologies for reducing the size of each embedded component, a System On Chip (SOC) technology for integrating a number of components into one chip, and a System In Package (SIP) technology for integrating a number of devices or chips into one package.

The SIP technology incorporates (or mounts) a plurality of silicon chips vertically or horizontally into one package. The SIP technology is an extension of the Multi-Chip Module (MCM) concept. Manufacturing a package using a horizontal mounting technique may be used for an MCM. A technique for stacking a plurality of chips vertically may be used in the SIP technology.

In a complete system, many passive devices such as resistors, capacitors and inductors are mounted on a system board in association with the characteristics of a plurality of stacked chips and to reduce power input noise. In SIP technology for stacking a plurality of chips, a number of through electrodes for electrical connection and through electrode plugs may be provided between the upper and lower chips. The through electrodes and the through electrode plugs may be formed of a metal such as tungsten (W), copper (Cu), or aluminum (Al). However, if the through electrodes and the through electrode plugs are formed of Cu, reliability may suffer since Cu is easily oxidized when exposed to the air. Oxidation may increase contact resistance.

SUMMARY

Embodiments relate to a method for manufacturing a System In Package (SIP) semiconductor device, and more particularly, to an SIP semiconductor device that prevents oxidization of a Cu plug for connection between electrodes. Embodiments relate to a method for manufacturing an SIP semiconductor device, which can prevent through electrodes and through electrode plugs formed of Cu from being easily oxidized when exposed to the air. Embodiments relate to a method for manufacturing an SIP semiconductor device in which Cu plugs are formed, while preventing them from being oxidized to maximize the reliability of the SIP semiconductor device.

Embodiments relate to a method for manufacturing a System In Package (SIP) semiconductor device which includes coating an upper surface of the semiconductor device including several elements and a first through electrode with a first Organic Solderability Preservative (OSP). An electrochemical plate (ECP) process is performed on the semiconductor device. A lower surface of the semiconductor device is coated with a second OSP, the lower surface including a Cu plug that has been formed over the first through electrode using the ECP process. The method may further include bonding the semiconductor device to another semiconductor device through the Cu plug. The step of performing the ECP process may include applying a current of 15-20 amps to the semiconductor device and rotating the semiconductor device at 60-150 revolutions per minute for 30-50 seconds to cause Cu to adhere, in a spherical shape, to the first through electrode.

The first semiconductor device may be bonded to a second semiconductor device in an SIP structure in which the first through electrode is electrically connected to a second through electrode of the second semiconductor device through the Cu plug. The step of bonding the first semiconductor device to the second semiconductor device may include heating the first semiconductor device to approximately 45° C.-55° C. to evaporate and remove the upper and lower OSPs. The method may include providing an adhesive paste around the Cu plug and bonding the first semiconductor device to the second semiconductor device through thermocompressive bonding.

DRAWINGS

Example FIGS. 1A to 1D are sectional views illustrating a procedure for forming an SIP semiconductor device according to embodiments.

DESCRIPTION

Example FIGS. 1A to 1D are sectional views illustrating a procedure for forming an SIP semiconductor device according to embodiments. In the figures, reference numeral "8" denotes an insulating layer such as borophosphosilicate glass (BPSG) and "9" denotes a via contact.

First, as shown in example FIG. 1A, a first semiconductor device 10 including a plurality of elements (or components) 11 and a first through electrode 12 over a first semiconductor substrate may be provided to form an SIP semiconductor device. An upper surface of the first semiconductor device 10 over which a Cu plug 13 is not to be formed may be coated with an upper Organic Solderability Preservative (OSP) 21. The upper OSP 21 may be coated over the upper surface with a uniform thickness since it is a transparent organic material with good adhesion. The upper OSP 21 can prevent Cu from being plated over the upper surface in a subsequent process of forming the Cu plug 13 since the upper OSP 21 is sensitive to heat so that it is oxidized and evaporated when heated.

Figure 1B:
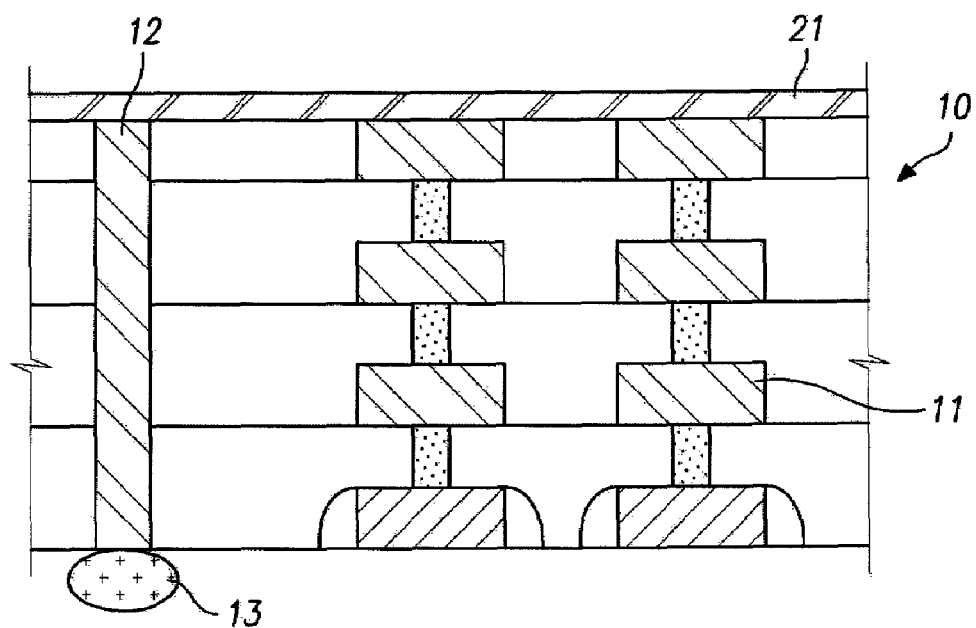

After the upper OSP 21 is coated, an electrochemical plate (ECP) process may be performed to form the Cu plug 13 over a lower surface of the first semiconductor device 10 as shown in example FIG. 1B. The ECP process may be performed in the following manner. The first semiconductor device 10 is dipped in an electrolyte solution with Cu dissolved therein. The first semiconductor device 10 may be, for example, rotated at approximately 60-150 rpm for approximately 30-50 seconds while a current of approximately 15-20 A is applied to the first semiconductor device 10. In this process, Cu may adhere in a spherical shape to the through electrode 12. The resulting Cu plug 13 may serve as a plug for the through electrode 12.

Figure 1C:
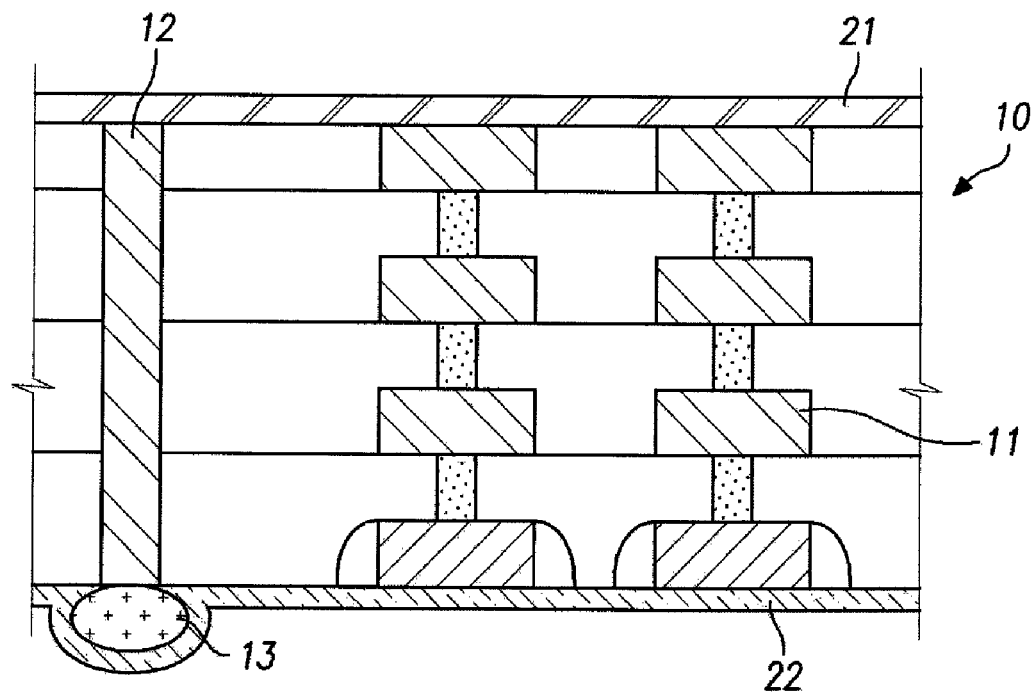

As shown in example FIG. 1C, a lower OSP 22 may be coated over the lower surface of the first semiconductor device 10 and the Cu plug 13. That is, after the ECP process is performed, the lower OSP 22 is coated over the lower surface of the first semiconductor device 10 including the Cu plug 13 so that the lower OSP 22 covers the Cu plug 13 to prevent oxidation of the Cu plug 13 since Cu is easily oxidized when exposed to the air.

Figure 1D:
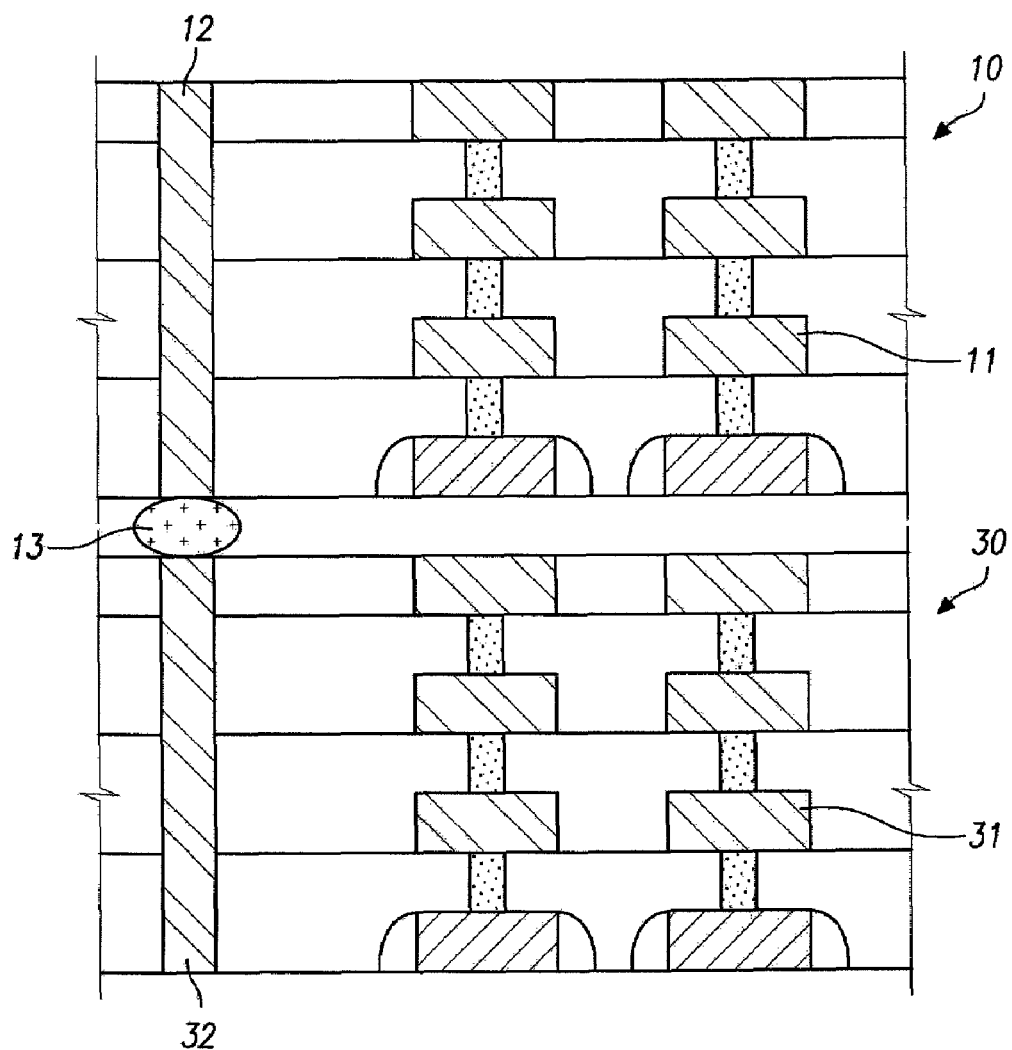

After the lower OSP 22 is applied, the first semiconductor device 10 and the second semiconductor device 30 are bonded together through the Cu plug 13 as shown in example FIG. 1D. This forms an SIP structure in which the first through electrode 12 is electrically connected to a second through electrode 32 through the Cu plug 13. To remove the upper and lower OSPs 21 and 22, the first semiconductor device 10 may be heated at a predetermined annealing temperature (for example, approximately 45° C.-55° C.) so that the upper and lower OSPs 21 and 22 are evaporated and removed. In addition, to bond the first and second semiconductor devices 10 and 30 together, an adhesive paste may be provided around the Cu plug 13. The first and second semiconductor devices 10 and 30 may be bonded together through thermocompressive bonding using the adhesive paste.

According to embodiments, the Cu plug 13 may be prevented from being easily oxidized when exposed to the air, thereby maximizing the electrical performance of the SIP semiconductor device. As is apparent from the above description, embodiments provide a method for manufacturing an SIP semiconductor device, in which upper and lower OSPs are used to prevent Cu plugs from being easily oxidized when exposed to the air, thereby improving the electrical performance of an SIP semiconductor device including through electrodes and through electrode plugs.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
coating an upper surface of a first semiconductor device, said first semiconductor device comprising a first through electrode, with a first organic solderability preservative;
on a lower surface of said first semiconductor device, forming a copper plug over the first through electrode using an electrochemical plate process; and
coating said lower surface of the first semiconductor device, including the copper plug, with a second organic solderability preservative.

2. The method of claim 1, comprising bonding the first semiconductor device to a second semiconductor device through the copper plug.

3. The method of claim 1, wherein said using an electrochemical plate process comprises causing copper to adhere, in a spherical shape, to the first through electrode.

4. The method of claim 1, wherein said using an electrochemical plate process comprises applying a current of approximately 15-20 amps to the first semiconductor device.

5. The method of claim 1, wherein said using an electrochemical plate process comprises rotating the first semiconductor device at approximately 60-150 revolutions per minute for approximately 30-50 seconds.

6. The method of claim 1, wherein said using an electrochemical plate process comprises applying a current of 15-20 amps to the first semiconductor device and rotating the first semiconductor device at 6-150 revolutions per minute for 30-50 seconds to cause copper to adhere, in a spherical shape, to the first through electrode.

7. The method of claim 2, wherein the first semiconductor device is bonded to a second semiconductor device in a system-in-package structure in which the first through electrode is electrically connected to a second through electrode of said second semiconductor device through the copper plug.

8. The method of claim 2, wherein said bonding the first semiconductor device to a second semiconductor device comprises heating the first semiconductor device to approximately 45° C.-55° C.

9. The method of claim 8, wherein said heating the first semiconductor device to approximately 45° C.-55° C. evaporates and removes the upper and lower organic solderability preservatives.

10. The method of claim 2, wherein said bonding the first semiconductor device to a second semiconductor device comprises providing an adhesive paste around the copper plug and bonding the first semiconductor device to a second semiconductor device.

11. The method of claim 10, wherein said bonding the first semiconductor device to a second semiconductor device employs thermocompressive bonding using the adhesive paste.

12. The method of claim 1, wherein the first semiconductor device comprises a plurality of device elements.

13. The method of claim 2, wherein the first semiconductor device and the second semiconductor devices each comprise a plurality of device elements.

14. An apparatus configured to:
coat an upper surface of a first semiconductor device, said first semiconductor device comprising a first through electrode, with a first organic solderability preservative;
on a lower surface of said first semiconductor device, form a copper plug over the first through electrode using an electrochemical plate process; and
coat said lower surface of the first semiconductor device, including the copper plug, with a second organic solderability preservative.

15. The apparatus of claim 14, configured to bond the first semiconductor device to a second semiconductor device through the copper plug.

16. The apparatus of claim 14, wherein said using an electrochemical plate process comprises causing copper to adhere, in a spherical shape, to the first through electrode.

17. The apparatus of claim 14, wherein said using an electrochemical plate process comprises applying a current of approximately 15-20 amps to the first semiconductor device.

18. The apparatus of claim 14, wherein said using an electrochemical plate process comprises rotating the first semiconductor device at approximately 60-150 revolutions per minute for approximately 30-50 seconds.

19. The apparatus of claim 1, wherein said using an electrochemical plate process comprises applying a current of 15-20 amps to the first semiconductor device and rotating the first semiconductor device at 60-150 revolutions per minute for 30-50 seconds to cause copper to adhere, in a spherical shape, to the first through electrode.

20. The apparatus of claim 15, wherein the first semiconductor device is bonded to a second semiconductor device in a system-in-package structure in which the first through electrode is electrically connected to a second through electrode of said second semiconductor device through the copper plug.

* * * * *